(12) United States Patent
Hsia et al.

(10) Patent No.: US 11,245,392 B1
(45) Date of Patent: Feb. 8, 2022

(54) GATE DRIVER CIRCUIT

(71) Applicant: SEMICONDUCTOR COMPONENTS INDUSTRIES, LLC, Phoenix, AZ (US)

(72) Inventors: Yi-Feng Hsia, Scottsdale, AZ (US); Tai-Hua Chen, Chandler, AZ (US); Kinam Song, Chandler, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/949,285

(22) Filed: Oct. 23, 2020

(51) Int. Cl.
*H03K 17/081* (2006.01)
*H03K 17/16* (2006.01)

(52) U.S. Cl.
CPC ..... *H03K 17/08104* (2013.01); *H03K 17/163* (2013.01)

(58) Field of Classification Search
CPC .................. H03K 17/08104; H03K 17/163

USPC .......................................... 327/380, 108–112
See application file for complete search history.

(56) References Cited

U.S. PATENT DOCUMENTS

| | | | |
|---|---|---|---|
| 2012/0249020 A1* | 10/2012 | Komatsu | H02M 1/32 318/139 |
| 2014/0375362 A1 | 12/2014 | Lobsiger et al. | |
| 2015/0171852 A1 | 6/2015 | Pang | |

* cited by examiner

*Primary Examiner* — Tomi Skibinski
(74) *Attorney, Agent, or Firm* — AMPACC Law Group, PLLC (57) ABSTRACT

An electronic circuit includes a gate driver circuit. The gate driver circuit receives an input signal and a signal corresponding to a current through a switch, and produces, using the input signal, an output signal for controlling the switch. In response to the input signal being de-asserted, the gate driver circuit may turn the switch off at a normal turn-off rate when the current through the switch is less than an over-current (OC) threshold, and at an OC turn-off rate that is slower than the normal turn-off rate when the current through the switch is greater than the OC threshold.

20 Claims, 6 Drawing Sheets

GATE DRIVER CIRCUIT

FIELD OF THE DISCLOSURE

The present disclosure relates to a gate driver circuit.

BACKGROUND

A switched-mode circuit, such as a switched-mode power supply, power converter, or motor controller, controls a current by turning one or more power switches (for example, one or more power transistors) on and off. Often, the current being controlled by the switched-mode circuit is a current through an inductive load.

The switched-mode circuit may turn the power switch off while a large amount of current is flowing through the power switch. Turning the power switch off quickly under such conditions is efficient but can create a large change in current per unit time ($\delta i/\delta t$) which can interact with components of a circuit to generate large and potentially damaging voltage spikes having high rates of voltage change per unit time ($\delta V/\delta t$). When the current through the power switch is especially high because of an overcurrent or short circuit condition, the risk of a damaging voltage spike may increase.

It would be advantageous to control the turning off of the power switch so as to limit the risks of voltage spikes generated thereby without reducing system efficiency.

BRIEF DESCRIPTION OF THE DRAWINGS

In the accompanying figures, like reference numerals refer to identical or functionally similar elements throughout the separate views.

DETAILED DESCRIPTION

Embodiments relate to limiting a current change per unit time ($\delta i/\delta t$) in switching mode circuits operating in an overcurrent or short circuit condition.

Insulated Gate Bipolar Transistor (IGBT) modules handling higher voltages and high currents, such as in motor drive and electric or hybrid electric vehicle applications, are increasingly in demand. The gate driver circuits of such modules are important in providing robustness and system efficiency. Enhancing robustness and reducing switching loss of the power device controlled by the gate driver circuit may produce conflicting goals for gate resistance design. Embodiments provide a gate driver circuit that can resolve this conflict to provide improved reverse bias safe operation area (RBSOA) and reduced switching loss for the controlled power device.

In the following detailed description, certain illustrative embodiments have been illustrated and described. As those skilled in the art would realize, these embodiments may be modified in various different ways without departing from the scope of the present disclosure. Accordingly, the drawings and description are to be regarded as illustrative and not restrictive. Like reference numerals designate like elements in the specification.

In an embodiment, a gate driver circuit generates a gate signal according to an input signal. The gate driver circuit controls a turn-off rate of a switch controlled by the gate signal according to a magnitude of a current flowing through the switch. In this document, a "turn-off rate" corresponds to a time it takes for a switch to go from being turned on to being turned off when the switch is turned off. The turn-off rate may be selected from among a plurality of rates according to whether the current corresponds to a normal current condition, one of one or more overcurrent conditions, or a short circuit condition. A turn-off rate selected for the normal current condition may be faster than a turn-off rate selected for overcurrent or short circuit conditions.

In an embodiment, the gate driver circuit turns off the gate signal in response to the de-assertion of the input signal when the current corresponds to the normal condition or an overcurrent condition, but turns the gate signal off immediately in response to the short circuit condition even if the input signal is still asserted. In this document, unless indicated otherwise, a signal being asserted may correspond to the signal having a high or logic-true value, and a signal being de-asserted may correspond to the signal having a low or logic-false value, but embodiments are not limited thereto.

Accordingly, embodiments may limit the $\delta i/\delta t$ during a turning off of a power switch by turning off the power switch more slowly when an overcurrent condition is sensed while still turning the power switch off quickly under normal conditions. Furthermore, embodiments may not wait for the input signal to be de-asserted when a short circuit condition is detected, and may turn the power switch off earlier and more slowly in response to the short circuit condition.

In this manner, system efficiency can be improved due to lower switching loss under normal loading operation, power delivery capacity may be improved by increasing how long a switch may be on in overcurrent situations, and a risk of damage from high $\delta V/\delta t$ and large voltage spikes caused by turning a power switch off may be reduced. Furthermore, power switches such as IGBTs may be fully protected in peak, overloading, and short circuit events, a full current range with smaller voltage spikes can be achieved by using multi-level trip points, and the RBSOA of power switches such as IGBTs may be expanded.

Figure 1:
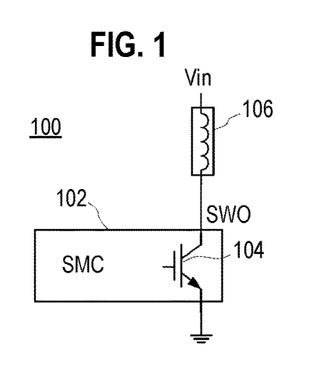
FIG. 1 illustrates a portion of a power system including a switched-mode circuit according to an embodiment.

FIG. 1 illustrates a portion of a power conversion system 100 according to an embodiment. The circuit 100 includes a switched-mode circuit (SMC) 102 including a power switch 104, and a load 106. The load 106 is connected between an input voltage Vin and a switch output SWO of the SMC 102. The load 106 is shown as an inductive load and the power switch 104 is shown as an IGBT, but embodiments are not limited thereto.

The SMC 102 includes circuitry (not shown) to turn the power switch 104 on and off. When the power switch 104 is on, current flows from the input voltage Vin through the load 106 and the power switch 104 to ground.

When the load 106 is an inductive load, the initial current that flows when the power switch 104 is turned on may be low or zero, and the current increases over the period when the power switch is turned on. As a result, the $\delta i/\delta t$ caused by the power switch 104 being turned off may have a larger magnitude than the δi/δt caused by the power switch 104 being turned on.

The δi/δt caused by the power switch 104 being turned on or off is dependent on the current through the power switch and the rate at which the power switch 104 is turned on or off. For a given level of current through the power switch, the δi/δt will be highest when the power switch 104 has a "hard" turn-on or turn-off that turns on or off the switch 104 rapidly, such as occurs when the gate capacitance of a MOSFET or IGBT is charged or discharged quickly. The δi/δt will be lower when the power switch 104 has a "soft" turn-on or turn-off that turns on or off the power switch 104 more slowly, such as when the gate capacitance of the MOSFET or IGBT is charged or discharged slowly.

However, turning the power switch 104 on or off more slowly reduces system efficiency and may increase the operating temperature of the power switch 104 because of the power dissipated across the power switch 104 when it is in an intermediate state between on and off. Accordingly, embodiments may control how slowly the power switch 104 turns off according to the current flowing through the power switch 104. In applications where the current flowing through the power switch 104 is small when the power switch 104 is turned on, embodiments of the SMC 102 may always perform a hard turn-on of the power switch 104.

Furthermore, when the current flowing through the power switch 104 has an excessive magnitude but that magnitude is less than a magnitude associated with a short circuit of the load 106, embodiments of the SMC 102 may allow the current to continue flowing until a planned end of a control pulse, and then in response to the end of the control pulse perform a soft turn-off of the power switch 104 according to the magnitude of the current. However, when the current flowing through the power switch 104 is equal to or greater than the current magnitude associated with the short circuit of the load 106, embodiments of the SMC 102 may perform a soft turn-off of the power switch 104 in response to the current flowing through the power switch 104 being equal to or greater than the current magnitude associated with the short circuit of the load 106, without waiting for the end of the control pulse.

Figure 2A:
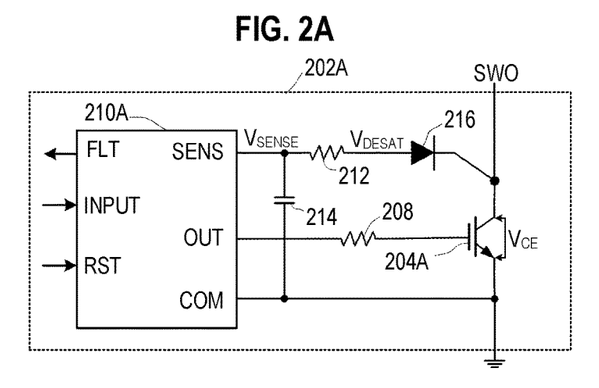
FIGS. 2A, 2B, and 2C illustrate switched-mode circuits according to various embodiments

FIG. 2A illustrates a switched-mode circuit (SMC) 202A according to an embodiment. The SMC 202A may be included in the SMC 102.

The SMC 202A includes a gate driver circuit 210A, a filter capacitor 214, a filter resistor 212, a desaturation diode 216, a gate resistor 208, and a power switch 204A. In embodiments, the power switch 204A may be a power IGBT; in other embodiments the power switch 204A may be a power Metal Oxide semiconductor Field Effect Transistor (MOSFET). The SMC 202A may further include circuits to generate an input signal INPUT and a reset signal RST, and to receive the fault signal FLT, and other circuits; these circuits are omitted in the interest of brevity.

The filter capacitor 214, filter resistor 212, and desaturation diode 216 operate to produce a voltage corresponding to a current flowing through the power switch 204A. When the power switch 204A is turned on, the gate driver circuit 210A provides a current from the sense signal SENS that forward biases the desaturation diode 216 so that a desaturation voltage $V_{DESAT}$ is produced that corresponds to the collector-emitter voltage $V_{CE}$ of the power switch 204A. The desaturation voltage $V_{DESAT}$ is filtered by a filter formed by the filter capacitor 214 and filter resistor 212 to produce a sense voltage $V_{SENSE}$. Because the value of the collector-emitter voltage $V_{CE}$ of the power switch 204A corresponds to an amount of current being conducted by the power switch 204A, a value of the sense voltage $V_{SENSE}$ corresponds to the amount of current being conducted by the power switch 204A. Accordingly, the gate driver circuit 210A uses the sense voltage $V_{SENSE}$ on the sense signal SENS to sense the current flowing through the power switch 204A.

The driver circuit 210A generates an output signal OUT according to the input signal INPUT. The input signal may be a pulse width modulated signal, and under normal operating conditions, the gate driver circuit asserts the output signal OUT to turn on the power switch 204 when a pulse is present on the input signal INPUT (in embodiments, when the input signal INPUT is high), and de-asserts the output signal OUT to turn off the power switch 204 when a pulse is not present on the input signal INPUT (in embodiments, when the input signal INPUT is low).

The output signal OUT is provided to a gate (i.e., a control terminal) of the power switch 204A through the gate resistor 208. The gate resistor 208 limits the rate at which a gate capacitance of the power switch 204A can be charged and discharged, and accordingly limits how fast the turn-on or turn-off of the power switch 204A can be.

A common signal COM of the gate driver corresponds to a ground signal. The fault signal FLT may be generated in response to a fault condition, such as a short circuit of the load attached to a switch output SWO of the SMC 202A. The reset signal RST may be used to reset the gate driver circuit 210A after a fault condition occurs.

In embodiments, during normal operation (such as when the current through the power switch 204A is within a design range), the gate driver circuit 210A may turn the power switch 204A on by charging the gate capacitance of the power switch 204A at a turn-on rate in response to a rising edge of the input signal INPUT, and may turn the power switch 204A off in response to a falling edge of the input signal INPUT by discharging the gate capacitance of the power switch 204A at a first turn-off rate. The turn-on rate may be determined by the gate resistor 208. In some embodiments, the first turn-off rate may have the same magnitude as the turn-on rate (but may have the opposite sign). The first turn-off rate corresponding to a turn-off rate of the power switch 204A during normal operation may be referred to as a normal turn-off rate.

During overcurrent operation (such as when the current through the power switch 204A is above a design range but less than a fault current value) the gate driver circuit 210A may turn the power switch 204A on in response to a rising edge of the input signal INPUT by charging the gate capacitance of the power switch 204A at the turn-on rate, and may turn the power switch 204A off in response to a falling edge of the input signal INPUT by discharging the gate capacitance of the power switch 204A at a second turn-off rate. The second turn-off rate may be slower than the first turn-off rate, and may be determined according to the magnitude of the current through the power switch 204A. The second turn-off rate may be referred to as an overcurrent (OC) turn-off rate.

In an embodiment, the second turn-off rate is selected according to the magnitude of the current through the power switch 204A from among a plurality of overcurrent turn-off rates. A first value for the second turn-off rate selected by the gate driver circuit 210A in response to a first current through the power switch 204A may be slower than second value for the second turn-off rate selected by the gate driver circuit 210A in response to a second current through the power switch 204A when the first current is greater than the second current.

During a fault condition (such as when a current through the power switch 204A is above a fault current value, such as a short circuit current value) the gate driver circuit 210A may turn the power switch 204A off immediately upon detecting the fault—without regard for the input signal INPUT—by discharging the gate capacitance of the power switch 204A at a third turn-off rate. The third turn-off rate may be slower than the first and second turn-off rates, and may be referred to as a short circuit (SC) turn-off rate.

In embodiments, the gate driver circuit 210A may also respond to the fault condition by signaling that the fault condition occurred using the fault signal FLT.

In embodiments, the gate driver circuit 210A may also respond to the fault condition by disabling turn-on of the power switch 204A until the gate driver circuit 210A is reset by the reset signal RST.

Figure 2B:
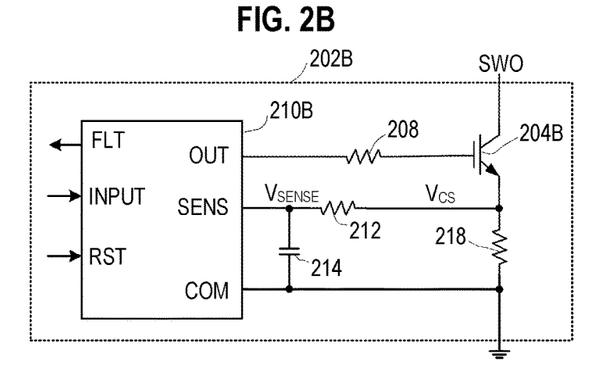

FIG. 2B illustrates SMC 202B according to another embodiment.

The SMC 202B includes a gate driver circuit 210B, a filter capacitor 214, a filter resistor 212, a gate resistor 208, a current sense resistor 218, and a power switch 204B. In embodiments, the power switch 204B may be an IGBT or MOSFET, but embodiments are not limited thereto. Like the SMC 202A of FIG. 2A, the SMC 202B may further include circuits to generate an input signal INPUT and a reset signal RST, to receive the fault signal FLT, and other circuits; these circuits are omitted in the interest of clarity and brevity.

The SMC 202B differs from the SMC 202A in that the SMC 202B determines a current through the power switch 204B by sensing a current sense voltage $V_{CS}$ across the current sense resistor 218 through which the current through the power switch 204B also passes, instead of sensing a voltage corresponding to the collector-emitter voltage across the power switch 204B. Accordingly, the gate driver circuit 210B may not provide the current from the sense signal SENS that the gate driver circuit 210A provides to forward bias the desaturation diode 216.

Other than the technique used to sense the current through the power switch 204B, the SMC 202B operates as described for the SMC 202A of FIG. 2A.

Figure 2C:
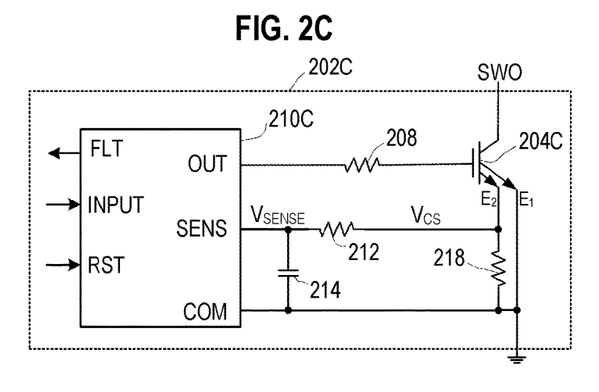

FIG. 2C illustrates SMC 202C according to yet another embodiment that includes a gate driver circuit 210C.

The SMC 202C differs from the SMC 202B in that the power switch 204C includes first and second emitters $E_1$ and $E_2$. A current through the second emitter $E_2$ may be smaller but proportional to a current through the first emitter $E_1$, so that the power dissipated across the current sense resistor 218 may be reduced.

Figure 3:
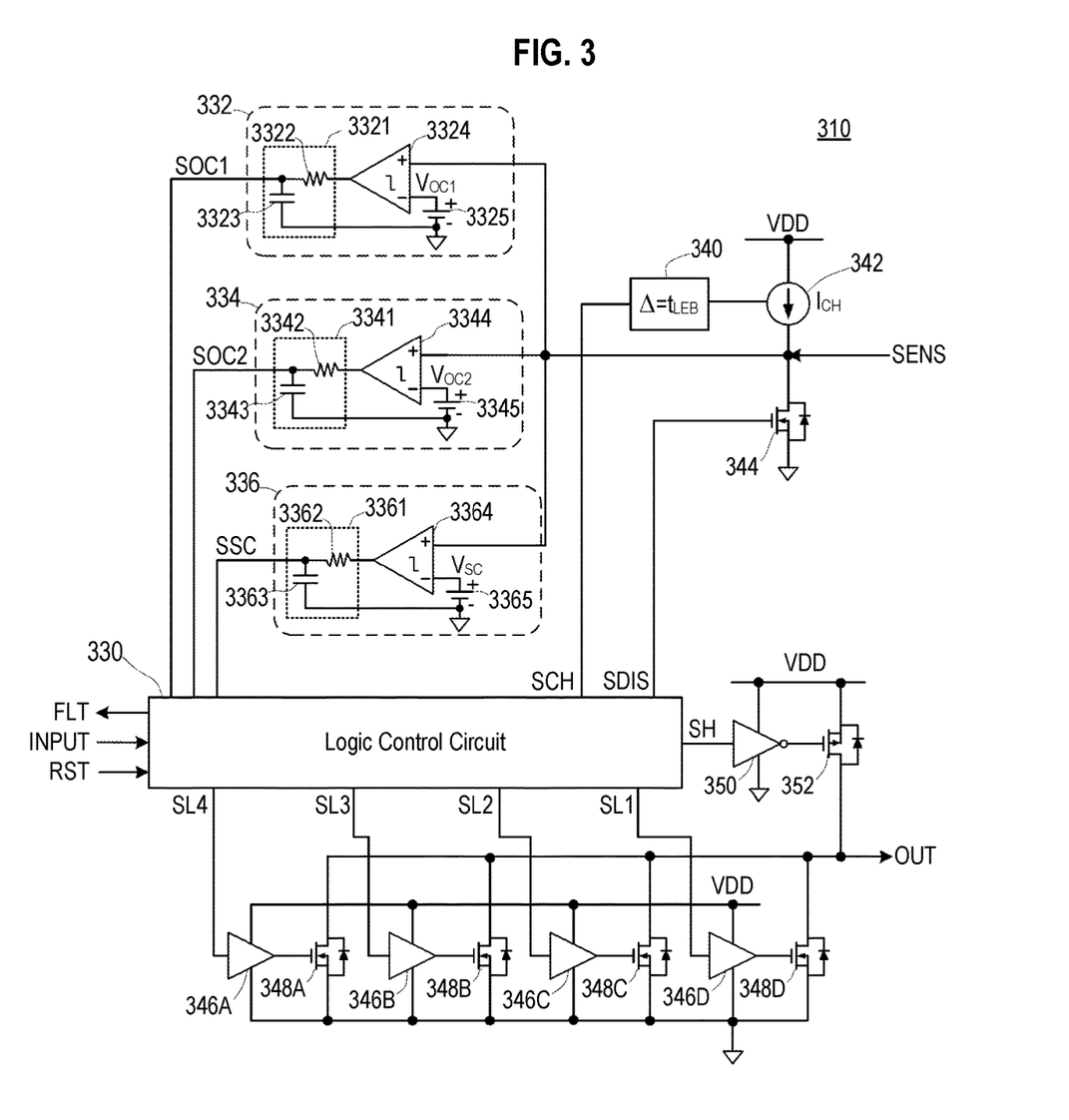
FIG. 3 illustrates a gate driver circuit according to an embodiment.

FIG. 3 illustrates a gate driver circuit 310 according to an embodiment. The gate driver circuit 310 may be included in any of the gate driver circuits 210A, 210B, or 210C.

The gate driver circuit 310 includes a logic control (LC) circuit 330, first, second, and third current evaluation circuits 332, 334, and 336, a delay circuit 340, a sense disable switch 344, a pull-up buffer 350, a pull-up switch 352, first, second, third, and fourth pull-down buffers 346A, 346B, 346C, and 346D and respectively corresponding first, second, third, and fourth pull-down switches 348A, 348B, 348C, and 348D. The gate driver circuit 310 shown in FIG. 3 includes a delay circuit 340 and a controllable current source 342, but these may be missing in some embodiments. For an example, a gate driver circuit designed for use with a current sense resistor, such as shown in FIGS. 2B and 2C, may not include the delay circuit 340 and controllable current source 342.

The first current evaluation circuit 332 includes a first filter 3321, a first comparator 3324, and a first reference voltage source 3325. The first filter 3321, which may be a low-pass filter, in FIG. 3 is a low-pass resistor-capacitor (RC) filter comprising a first filter resistor 3322 and a first filter capacitor 3323.

The first reference voltage source 3325 produces a first OC threshold voltage $V_{OC1}$. The first comparator 3324 receives the first OC threshold voltage $V_{OC1}$ on a negative input and a sense signal SENS on a positive input, the sense signal SENS having a voltage corresponding to a sensed current. An output of the first comparator 3324 is processed by the first filter 3321 to produce a first OC signal SOC1.

The second current evaluation circuit 334 includes a second filter 3341, a second comparator 3344, and a second reference voltage source 3345. The second filter 3341, which may be a low-pass filter, in FIG. 3 is an RC filter comprising a second filter resistor 3342 and a second filter capacitor 3343.

The second reference voltage source 3345 produces a second OC threshold voltage Voce. The second comparator 3344 receives the second OC threshold voltage Voce on a negative input and the sense signal SENS on a positive input. An output of the second comparator 3344 is processed by the second filter 3341 to produce a second OC signal SOC2.

The third current evaluation circuit 336 includes a third filter 3361, a third comparator 3364, and a third reference voltage source 3365. The third filter 3361, which may be a low-pass filter, in FIG. 3 is an RC filter comprising a third filter resistor 3362 and a third filter capacitor 3363.

The third reference voltage source 3365 produces a short circuit (SC) threshold voltage $V_{SC}$. The third comparator 3364 receives the SC threshold voltage $V_{SC}$ on a negative input and the sense signal SENS on a positive input. An output of the third comparator 3364 is processed by the third filter 3361 to produce a SC signal SSC.

The first OC threshold voltage $V_{OC1}$, second OC threshold voltage Voce, and SC threshold voltage $V_{SC}$ have values respectively corresponding to values of the sense signal SENS corresponding to a first OC condition, a second OC condition, and a SC condition. In embodiments, a sensed current corresponding to the first OC condition has a magnitude less than a sensed current corresponding to the second OC condition and the sensed current corresponding to the second OC condition has a magnitude less than a sensed current corresponding to the SC condition, and therefore $V_{OC1} < V_{OC2} < V_{SC}$.

In embodiments, the time constants of the first, second, and third filters 3321, 3341, and 3361 may differ from each other. Typically, the time constants of the first, second, and third filters 3321, 3341, and 3361 may be several hundred nanoseconds.

The sense disable switch 344 operates to clamp the sense signal SENS to ground when the sense disable signal SDIS is asserted (by being driven to high level) by the LC circuit 330, and may operate to prevent the gate driver circuit 310 reacting inappropriately to high levels of the sense signal SENS that may be present in the period following a rising edge of the output signal OUT (when the power switch has recently been turned on) and/or to discharge a filter capacitor such as the filter capacitor 214 in FIGS. 2A-2C. The sense disable signal SDIS controls, using sense disable switch 344, whether use of the sense signal SENS is enabled or disabled.

The controllable current source 342 may provide a bias current ICH to circuits connected to the sense signal SENS. The bias current ICH may forward-bias a diode used to block high voltages across the power switch from reaching the sense signal SENS. The controllable current source 342 is activated and deactivated according to a bias current control signal SCH. The delay circuit 340 may delay the activation and de-activation of the controllable current source 342 by a sense blanking delay $t_{LEB}$. The sense blanking delay $t_{LEB}$ provides time for a power switch to respond to the output signal OUT. Parasitic elements of a PCB on which the gate driver circuit 310 is disposed (or outside of the gate driver IC) may impact this response time. In embodiments, the sense blanking delay $t_{LEB}$ may be in the range of 100 to 300 nanoseconds.

The pull-up buffer 350 controls the pull-up switch 352 according to the high switch signal SH produced by the LC circuit 330. The pull-up buffer 350 causes the pull-up switch 352 to turn on when the high switch signal SH is high, and causes the pull-up switch 352 to turn off when the high switch signal SH is low. Turning the pull-up switch 352 on sources current to the output signal OUT, which may charge a gate capacitance of a power switch coupled thereto, turning the power switch on.

The first, second, third, and fourth pull-down buffers 346A, 346B, 346C, and 346D respectively control the first, second, third, and fourth pull-down switches 348A, 348B, 348C, and 348D according to respective first, second, third, and fourth low switch signals SL1, SL2, SL3, and SL4 produced by the LC circuit 330, so that the first to fourth pull-down switches 348A to 348D are on when the respective one of the first to fourth low switch signal SL1 to SL4 is high and are off when the respective one of the first to fourth low switch signal SL1 to SL4 is low. Each of the first to fourth pull-down switches 348A to 348D operates to sink current from the output signal OUT, which may discharge the gate capacitance of the power switch coupled thereto, turning the power switch off.

The magnitude of the current that the first to fourth pull-down switches 348A to 348D sink from the output signal OUT may depend on how many of the fourth pull-down switches 348A to 348D are turned on. In an embodiment where the on resistance of the first to fourth pull-down switches 348A to 348D are not the same as each other, the magnitude of the current that the first to fourth pull-down switches 348A to 348D sink from the output signal OUT may also depend on which of the first to fourth pull-down switches 348A to 348D are turned on. The turn-off rate of the power switch may be determined by the magnitude of the current that the first to fourth pull-down switches 348A to 348D collectively sink, with the power switch turning off more quickly when the magnitude of the sunk current is higher.

Put another way, in an embodiment, the turn-off rate of the power switch controlled by the output signal OUT may be determined by the resistance of a pull-down path between the output signal OUT and ground, and the resistance RPD of the pull-down path decreases when more of the first to fourth pull-down switches 348A to 348D are turned on, according to:

$$R_{PB} = \frac{1}{\sum_{i=1}^{N}\left(\frac{SL(i)}{R_{ON}(PD(i))}\right)} \quad \text{Equation 1}$$

wherein N is the number of pull-down switches, SL(i) is 0 when the $i^{th}$ low switch signal is low and 1 when it is high, and $R_{ON}(PD(i))$ is the on resistance of the $i^{th}$ pull-down switch. In an illustrative example, an on resistance of each of the pull-down switches may be 4 ohms. In embodiments, the on resistance $R_{ON}(PD(i))$ of the pull-down switches may be programmable, either collectively or individually.

In another embodiment, the first to fourth pull-down switches 348A to 348D may be replaced by first to fourth controllable current sinks that each sink current when the corresponding one of the first to fourth low switch signals SL1 to SL4 is high. In an embodiment, the amount of current each of the first to fourth controllable current sinks sink may be programmable, either collectively or individually.

The example of FIG. 3 shows three current evaluation circuits, four low switch signals, and four pull-down switches, but embodiments are not limited thereto. Embodiments may include M current evaluation circuits, M≥2 (respectively sensing M−1 OC conditions and the SC condition). Embodiments may support a hard-off turn-off for normal operation, one or more OC soft-off turn-off for one or more OC conditions, and a SC turn-off for the SC condition.

In an embodiment, a gate driver circuit provides a hard-off turn-off rate for normal operations, a SC soft-off rate for the SC condition, and controls an OC turn-off rate according to the magnitude of the sensed current at a time corresponding to the falling edge of the input signal INPUT.

Accordingly, the gate driver circuit 310 may control a turn-off rate of a power switch according to a sensed current through the power switch, and may also control a time at which the power switch is turned off according to an input signal and the sensed current, as explained below with reference to FIGS. 4 and 5.

Figure 4:
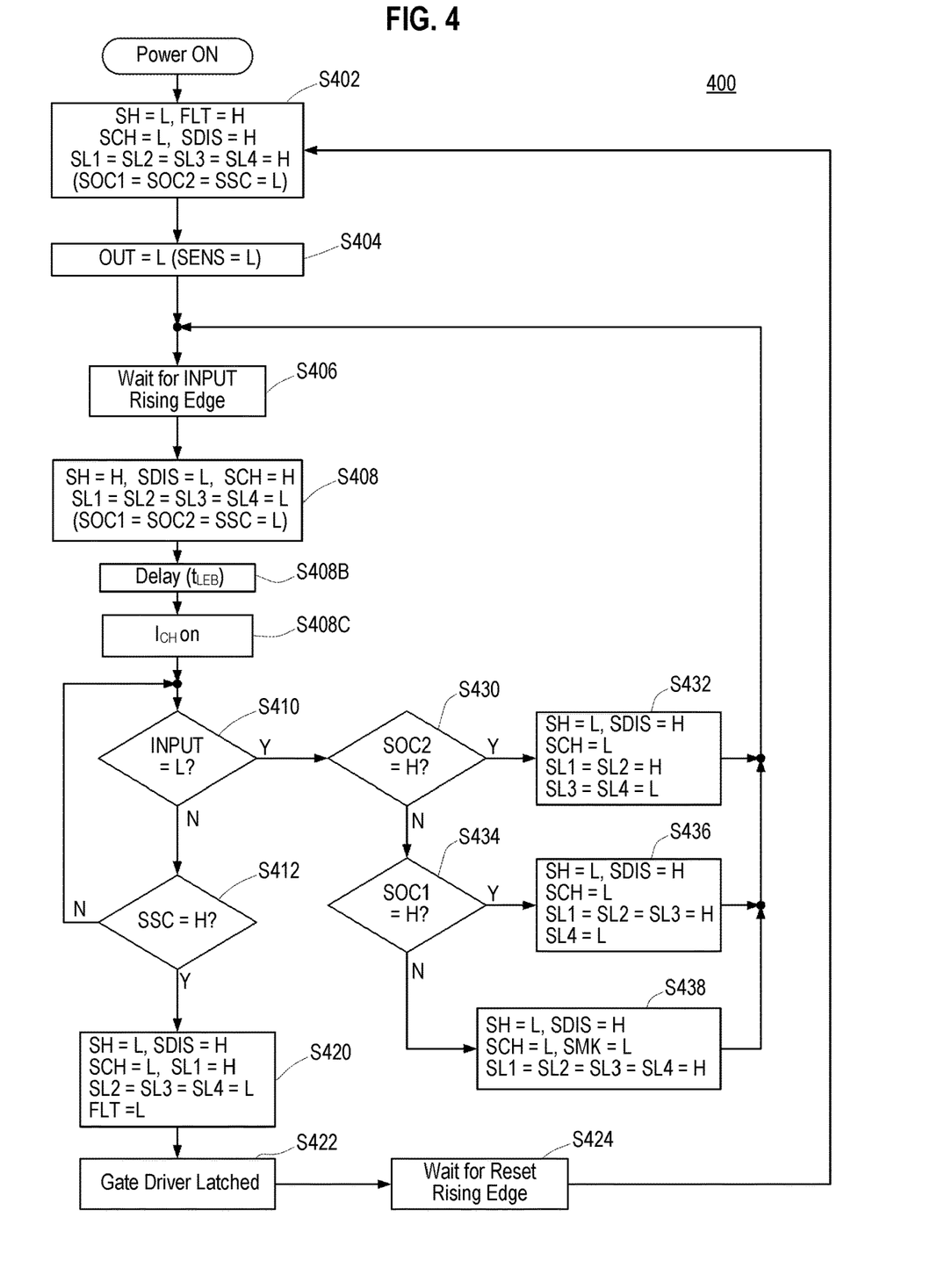
FIG. 4 illustrates a process of a gate driver circuit according to an embodiment.

FIG. 4 illustrates a process 400 of a gate driver circuit according to an embodiment, such as the gate driver circuit 310 of FIG. 3. The process 400 will be explained with respect to gate driver circuit 310, and may be primarily performed by the LC circuit 330, but embodiments are not limited thereto.

Figure 5:
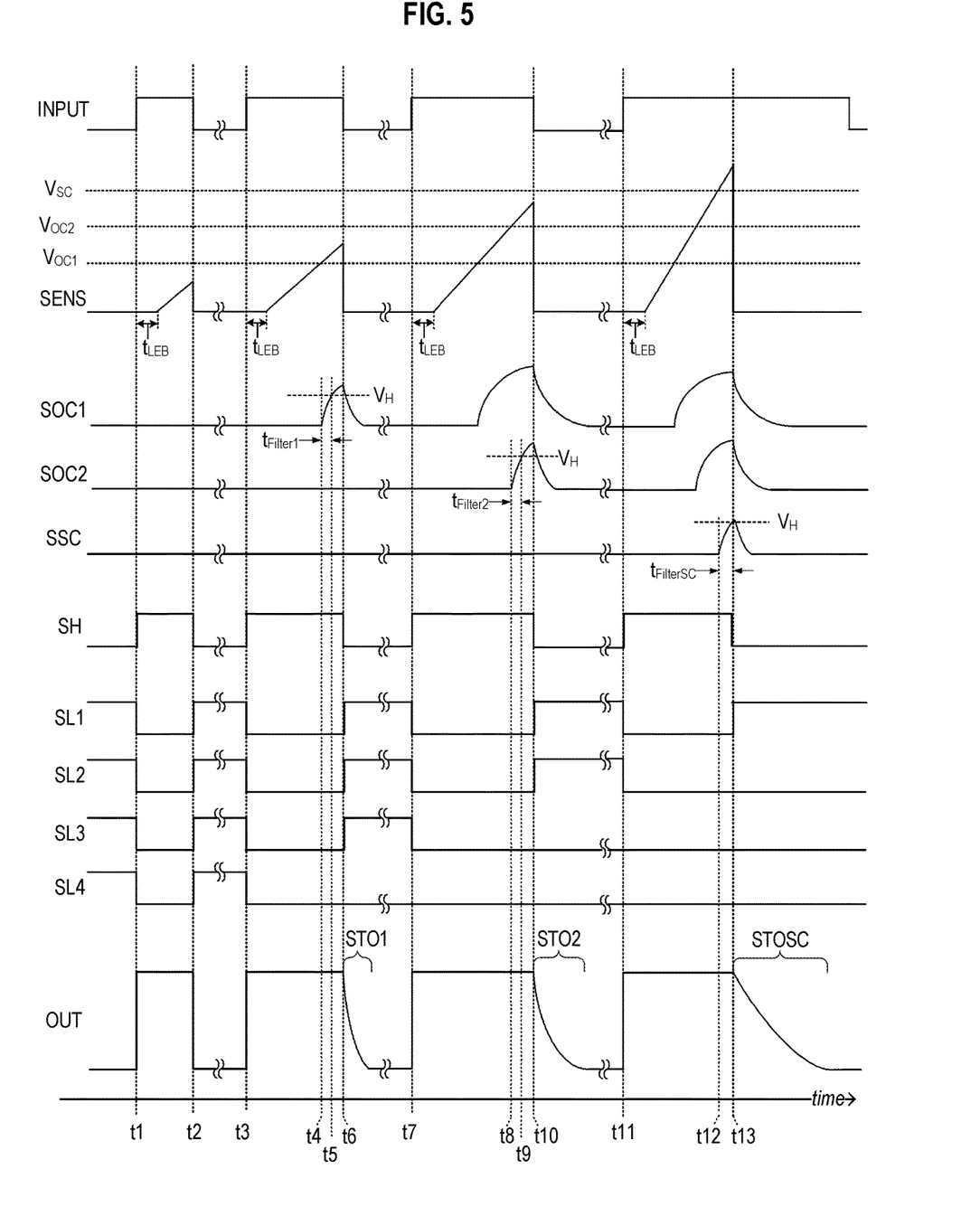
FIG. 5 illustrates operation of a gate driver circuit according to an embodiment.

FIG. 5 shows waveforms illustrating operation of a gate driver circuit according to an embodiment, such as the gate driver circuit 310. The waveforms illustrate values over time of an input signal INPUT, a sense signal SENS, a first OC signal SOC1, a second OC signal SOC2, an SC signal SSC, a high switch signal SH, first to fourth low switch signals SL1 to SL4, and an output signal OUT.

When the gate driver circuit 310 is powered on, the process 400 proceeds to S402.

At S402, the process 400 sets the high switch signal SH to a low value, a fault signal FLT to a high value, a bias current control signal SCH to a low value, a sense disable signal SDIS to a high value, and the first to fourth low switch signals SL1 to SL4 to high values. As a result, the controllable current source 342 is turned off, the sense disable switch 344 is turned on to clamp the sense signal SENS, the pull-up switch 352 is turned off, and the first to fourth pull-down switches 348A to 348D are turned on. In this example, the fault signal FLT having the high value indicates that no fault condition has occurred. At this time, the first and second OC signals SOC1 and SOC2 and the SC signal SSC should be low. The process 400 then proceeds to S404.

At S404, because the first to fourth pull-down switches 348A to 348D are turned on, the output signal OUT has a low level, so that a power switch controlled by the output signal OUT is turned off. Also, because the sense disable switch 344 is turned on, the sense signal SENS has a low level. The process 400 then proceeds to S406.

At S406, the process 400 waits for a rising edge of the input signal INPUT. In response to the rising edge of input signal INPUT, the process 400 proceeds to S408; otherwise, the process 400 remains at S406.

At S408, the process 400 sets the first to fourth low switch signals SL1 to SL4 to low values and the sense disable signal SDIS to a high value, causing the first to fourth pull-down switches 348A to 348D and the sense disable switch 344 to turn off. The process 400 sets the high switch signal SH and the bias current control signal SCH to a high value. Setting the high switch signal SH to the high value turns on the pull-up switch 352. The process 400 may provide a small delay between turning the first to fourth pull-down switches 348A to 348D off and turning the pull-up switch 352 on to prevent the pull-up switch 352 from being on when one of the first to fourth pull-down switches 348A to 348D are still on.

After a sense blanking delay $t_{LEB}$ indicated by 5408B (such as provided by the delay circuit 340), at S408C the process 400 turns on the controllable current source 342 to provide the bias current ICH to the sense signal SENS. The process 400 then proceeds to S410.

Signal values corresponding to the process 400 being at S408 are shown in FIG. 5 at each of the first, third, seventh, and eleventh times t1, t3, t7, and t11.

At S410, the process 400 determines whether the input signal INPUT has a low value, and if it does, the process 400 proceeds to S430; otherwise the process 400 proceeds to S412.

At S412, the process 400 determines whether the SC signal SSC has a high value. In embodiments, the SC signal SSC is produced by the third current evaluation circuit 336, and has a high value when the sense signal SENS has had a value higher than the SC threshold voltage $V_{SC}$ for longer than a time constant of the third filter 3361 (in FIG. 5, SC filter time $t_{FilterSC}$ beginning at the twelfth time t12). In an embodiment, the SC signal SSC is considered to have a high value when the value of the SC signal SSC is greater than a logic high threshold voltage $V_H$ as shown in FIG. 5. The SC signal SSC having a high value may indicate that a short circuit is present in the load of the power switch.

In response to the SC signal SSC having a high value, the process 400 proceeds to S420; otherwise the process 400 returns to S410.

Signal values corresponding to the process 400 being at S410 and S412 are shown in FIG. 5 in each of the interval between the first and second times t1 and t2, the interval between the third and sixth times t3 and t6, the interval between the seventh and tenth times t5 and t10, and the interval between the eleventh and thirteenth times t11 and t13. Signal values corresponding to the process 400 proceeding from S410 to S430 are shown at each of the second time t2, the sixth time t6, and the tenth time t10. Signals values corresponding to the process 400 proceeding from S412 to S420 are shown at the thirteenth time t13.

Beginning at S420, the process 400 may perform processing for responding to a short circuit (SC) condition.

At S420, the process 400 sets the high switch signal SH to a low value, a fault signal FLT to a low value to indicate a fault condition, a bias current control signal SCH to a low value, a sense disable signal SDIS to a high value, the first low switch signal SL1 to a high value, and the second to fourth low switch signals SL2 to SL4 to low values. As a result, the controllable current source 342 is turned off, the sense disable switch 344 is turned on, the pull-up switch 352 is turned off, the first pull-down switch 348A is turned on, and the second to fourth pull-down switches 348B to 348D remain off. The process 400 may impose a small delay between turning the pull-up switch 352 off and turning the first pull-down switch 348A on to prevent both of them from being on simultaneously.

Signal values corresponding to the process 400 being at S420 are shown in FIG. 5 starting at the thirteenth time t13. Because only the first pull-down switch 348A of the first to fourth pull-down switches 348A to 348D is turned on, the gate capacitance of the power switch discharges relatively slowly, causing the power switch to perform the SC soft turn-off STOSC having a longer duration than a normal turn-off or an OC turn-off. The longer duration of the SC soft turn-off STOSC operates to reduce δi/δt and prevent damage to the power switch and related circuits.

At S422, the process 400 latches the gate driver circuit, so that rising edges of the input signal INPUT are prevented from causing the output signal OUT from being driven high. The process 400 then proceeds to S424.

At S424, the process 400 waits for a rising edge of the reset signal RST. In response to the rising edge of the rest signal RST, the process 400 proceeds to S406; otherwise the process 400 remains at S424.

Beginning at S430, the process 400 may perform processing for a normal operation or an overcurrent condition.

At S430, the process 400 determines whether the second OC signal SOC2 has a high value. In embodiments, the second OC signal SOC2 is produced by the second current evaluation circuit 334, and has a high value when the sense signal SENS has had a value higher than the second OC threshold voltage Voce for longer than a time constant of the second filter 3341 (in FIG. 5, OC2 filter time $t_{Filter2}$ beginning at the eight time t8). In an embodiment, the second OC signal SOC2 is considered to have a high value when the value of the second OC signal SOC2 is greater than a logic high threshold voltage $V_H$. The second OC signal SOC2 having a high value may indicate that a larger of two OC conditions is occurring in the power switch.

In response to the second OC signal SOC2 having a high value, at S430 the process 400 proceeds to S432; otherwise the process 400 proceeds to S434.

At S432, the process 400 sets the high switch signal SH to a low value, the bias current control signal SCH to a low value, the sense disable signal SDIS to a high value, the first and second low switch signals SL1 and SL2 to a high value, and the third and fourth low switch signals SL3 and SL4 to low values. As a result, the controllable current source 342 is turned off, the sense disable switch 344 is turned on, the pull-up switch 352 is turned off, the first and second pull-down switches 348A and 384B are turned on, and the third and fourth pull-down switches 348C and 348D remain off. The process 400 may impose a small delay between turning the pull-up switch 352 off and turning the first and second pull-down switches 348A and 348B. The process 400 proceeds from S432 to S406.

Signal values corresponding to the process 400 being at S432 are shown in FIG. 5 starting at the tenth time t10. Because only the first and second pull-down switches 348A and 348B of the first to fourth pull-down switches 348A to 348D are turned on, the gate capacitance of the power switch discharges more slowly than if more of the first to fourth pull-down switches 348A to 348D were turned on, but more quickly than if only the first pull-down switch 348A was turned on, causing the power switch to perform the second OC soft turn-off STO2 having a longer duration than a normal turn-off and a shorter duration than the SC turn-off STOSC. The longer duration of the second OC soft turn-off STO2, compared to a normal turn-off, operates to reduce δi/δt and prevent damage to the power switch.

At S434, the process 400 determines whether the first OC signal SOC1 has a high value. In embodiments, the first OC signal SOC1 is produced by the first current evaluation circuit 332, and has a high value when the sense signal SENS has had a value higher than the first OC threshold voltage $V_{OC1}$ for longer than a time constant of the first filter 3321 (in FIG. 5, OC1 filter time $t_{Filter1}$ beginning at the fourth time t4). In an embodiment, the first OC signal SOC1 is considered to have a high value when the value of the first OC signal SOC1 is greater than a logic high threshold voltage $V_H$. The first OC signal SOC1 having a high value may indicate that a smaller of two OC conditions is occurring in the power switch.

In response to the first OC signal SOC1 having a high value, at S434 the process 400 proceeds to S436; otherwise the process 400 proceeds to S438.

At S436, the process 400 sets the high switch signal SH to a low value, the bias current control signal SCH to a low value, the sense disable signal SDIS to a high value, the first, second, and third low switch signals SL1, SL2, and SL3 to a high value, and the fourth low switch signal SL4 to a low value. As a result, the controllable current source 342 is turned off, the sense disable switch 344 is turned on, the pull-up switch 352 is turned off, the first, second, and third pull-down switches 348A, 384B, and 384C are turned on, and the fourth pull-down switch 348D remains off. The process 400 may impose a small delay between turning the pull-up switch 352 off and turning the first to third pull-down switches 348A to 348C on. The process 400 proceeds from S436 to S406.

Signal values corresponding to the process 400 being at S436 are shown in FIG. 5 starting at the sixth time t6. Because only the first to third pull-down switches 348A to 348C of the first to fourth pull-down switches 348A to 348D are turned on, the gate capacitance of the power switch discharges more slowly than if all of the first to fourth pull-down switches 348A to 348D were turned on, but more quickly than if one or more of the first and second pull-down switches 348A and 348B were turned on, causing the power switch to perform the first OC soft turn-off STO1 having a longer duration than a normal turn-off and a shorter duration than the second OC soft turn-off STO2 or the SC soft turn-off STOSC. The longer duration of the first OC soft turn-off STO1, compared to a normal turn-off, operates to reduce δi/δt and prevent damage to the power switch.

At S438, the process 400 sets the high switch signal SH to a low value, the bias current control signal SCH to a low value, the sense disable signal SDIS to a high value, and the first to fourth low switch signals SL1 to SL4 to a high value. As a result, the controllable current source 342 is turned off, the sense disable switch 344 is turned on, the pull-up switch 352 is turned off, and the first to fourth pull-down switches 348A to 384D are turned on. The process 400 may impose a small delay between turning the pull-up switch 352 off and turning the first to fourth pull-down switches 348A to 348D on. The process 400 proceeds from S438 to S406.

Signal values corresponding to the process 400 being at S438 are shown in FIG. 5 starting at the second time t2. Because all of the first to fourth pull-down switches 348A to 348D are turned on, the gate capacitance of the power switch discharges as quickly as possible, causing the power switch to perform a hard turn-off. Because there is not an OC or SC condition, the hard turn-off will not cause damage.

In embodiments, an SC condition that might damage the power switch or associated circuitry if not responded to promptly may be dealt with by performing a soft turn-off of the power switch as soon as the SC condition is detected, even when that while the input signal INPUT is high. However, when an OC condition exists that does not in itself present a danger but that might cause damage because of excessively high δi/δt if a normal hard turn-off was performed, turning off the power switch is done when the input signal INPUT goes low (as is the case in normal operation) but a soft turn-off is performed instead of a normal hard turn-off. How "soft" a soft turn-off is performed may depend on the magnitude of current causing the OC condition. By not shortening the duration of the power switch being on when the OC conditions exist, higher power output may be obtained from the power switch.

The shorter duration of the first OC soft turn-off STO1 compared to the second OC soft turn-off STO2 improves system efficiency by reducing the power dissipated while the power switch is turned off, relative to the second OC soft turn-off STO2, when the OC condition involves current magnitudes for which a faster turn-off than that performed by the second OC soft turn-off STO2 is still slow enough to prevent damage to the power switch.

Using a hard turn-off instead of a soft turn-off under normal operation improves system efficiency by minimizing the power dissipated while the power switch is turned off when there is little damage prevention gained from using a soft turn-off.

Figure 6:
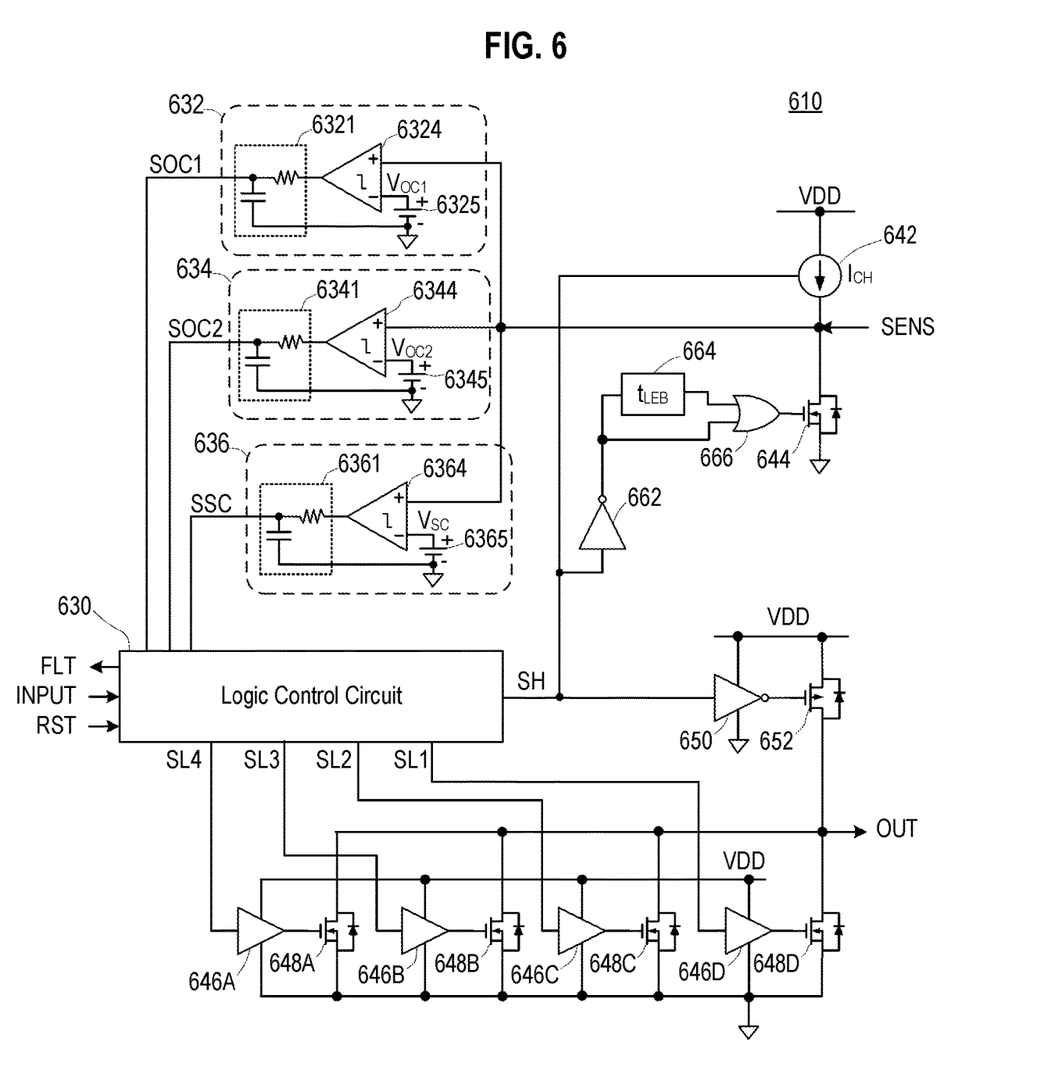
FIG. 6 illustrates a gate driver circuit according to another embodiment.

FIG. 6 illustrates a gate driver circuit 610 according to another embodiment.

The gate driver circuit 610 includes a logic control (LC) circuit 630, first, second, and third current evaluation circuits 632, 634, and 636, an inverter 662, a delay circuit 664, an OR gate 666, a sense disable switch 644, a pull-up buffer 650, a pull-up switch 652, first, second, third, and fourth pull-down buffer 646A, 646B, 646C, and 646D and respectively corresponding first, second, third, and fourth pull-down switches 648A, 648B, 648C, and 648D. The gate driver circuit 610 shown in FIG. 6 also includes a controllable current source 642, but that may be omitted from some embodiments. For an example, a gate driver circuit that is designed for use with a current sense resistor, such as shown in FIGS. 2B and 2C, may not require the controllable current source 642.

The first current evaluation circuit 632 includes a first filter 6321, a first comparator 6324, and a first reference voltage source 6325. The first reference voltage source 6325 produces a first OC threshold voltage $V_{OC1}$.

The second current evaluation circuit 634 includes a second filter 6341, a second comparator 6344, and a second reference voltage source 6345. The second reference voltage source 6345 produces a second OC threshold voltage Voce.

The third current evaluation circuit 636 includes a third filter 6361, a third comparator 6364, and a third reference voltage source 6365. The third reference voltage source 6365 produces a short circuit (SC) threshold voltage $V_{SC}$.

Operation of the first, second, and third current evaluation circuits 632, 634, and 636 may be as described for the first, second, and third current evaluation circuits 332, 334, and 336 of FIG. 3, and accordingly further description is omitted.

The pull-up buffer 650, pull-up switch 652, first to fourth pull-down buffers 646A to 646D, and first to fourth pull-down switches 648A to 648D respectively operate in the manner described for the pull-up buffer 350, pull-up switch 352, first to fourth pull-down buffers 346A to 346D, and first to fourth pull-down switches 348A to 348D of FIG. 3, and accordingly a description of their operation is omitted.

The gate driver circuit 610 differs from the gate driver circuit 310 in that the controllable current source 642 and the sense disable switch 644 are controlled, using the high switch signal SH instead of using dedicated signals.

The controllable current source 342 may provide a bias current ICH to circuits connected to the sense signal SENS. The controllable current source 642 is switched on to provide a bias current when the high switch signal SH is high, that is, when the output signal OUT is being pulled up to turn on the power switch.

The sense disable switch 644 operates to clamp the sense signal SENS to ground when on. The inverter 662, delay circuit 664, and OR gate 666 operate to turn the sense disable switch 644 on when the high switch signal SH is low, and for a period of time equal to the sense blanking delay $t_{LEB}$ after the rising edge of the high switch signal SH, so that the sense signal SENS is not affected by the delay in the output signal OUT turning the power switch fully on.

The LC circuit 630 differs from the LC circuit 330 of FIG. 3 in that the LC circuit 330 does not produce separate signals to control the controllable current source 642 and the sense disable switch 644.

Figure 7:
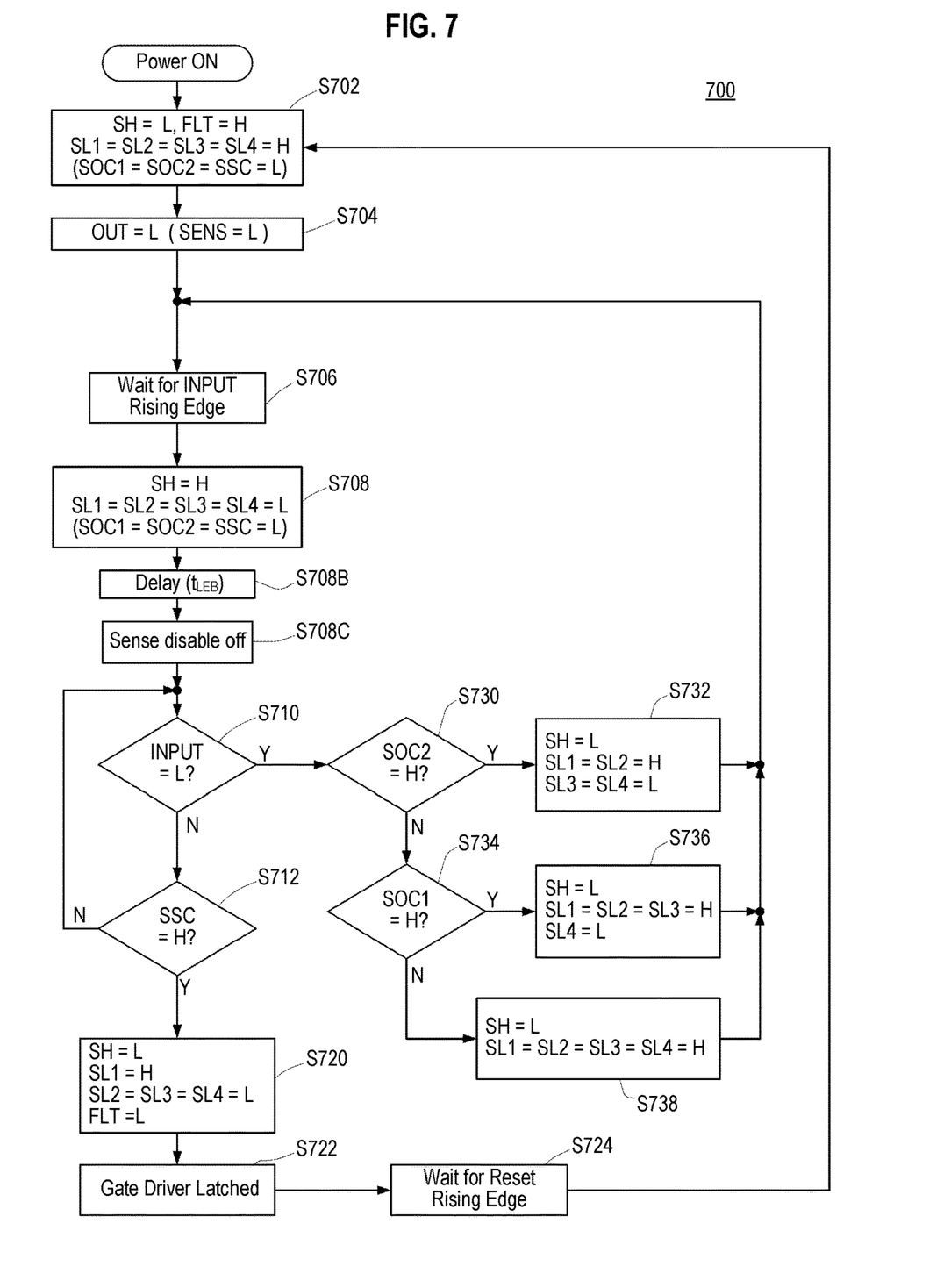
FIG. 7 illustrates a process of a gate driver circuit according to another embodiment.

FIG. 7 illustrates a process 700 of a gate driver circuit according to an embodiment, such as, for example, the gate driver circuit 610.

The process 700 is similar to the process 400 of FIG. 4, with steps S702, S704, S706, S710, S712, S720, S722, S724, S730, S732, S734, A736, and S738 respectively differing from S402, S404, S406, S410, S412, S420, S422, S424, S430, S432, S434, S436, and S438 in that the SDIS and SCH signal are not generated.

S708 differs from S408 in that the SDIS and SCH signal are not generated, the controllable current source 642 is turned on by the assertion of the high switch signal SH, and the sense disable switch 744 is not immediately turned off. Instead, after a delay equal to the sense blanking delay $t_{LEB}$, represented by S708B, the sense disable switch 744 is turned off, as indicated by S708C.

Embodiments permit the use of a small value for gate resistance (such as provided by the gate resistor 208 in FIGS. 2A to 2C) while still supporting the wide current range of a power switch by controlling voltage spikes that might be produced by high δi/δt values. Accordingly, system efficiency can be improved due to less switching loss while operating under normal loading conditions, while still preventing power switch damage risk by high δV/δt and voltage spikes. The power switch is fully protected in peak or overloading conditions and from short circuit events in the system.

Embodiments enable the full current range of the power switch to be utilized, reducing voltage spikes by using multi-level trip points to control turning off the power switch. This extends the RBSOA of a power switch such as an IGBT.

Embodiments turn off the power switch as determined by an input signal when the current through the power switch is less than a value that might cause immediate harm to the power switch. When turning off the power switch in response to the input signal signaling to turn it off, a soft-off may be performed wherein the turn-off rate of the power switch may be determined by the current through the power switch when that current is greater than a design value. However, when the current is at the level that might cause immediate harm, the power switch may be turned off immediately (without regard to the input signal) at a turn-off rate as slow or slower than the soft-off turn-off rate.

Embodiments of the present disclosure include electronic devices, e.g., one or more packaged semiconductor devices, configured to perform one or more of the operations described herein. However, embodiments are not limited thereto.

While this invention has been described in connection with what is presently considered to be practical embodiments, embodiments are not limited to the disclosed embodiments. Instead, embodiments may include various modifications and equivalent arrangements included within the scope of the appended claims. The order of operations described in a process is illustrative and some operations may be re-ordered. Further, two or more embodiments may be combined.

What is claimed is:

1. An electronic circuit, comprising:
a gate driver circuit configured to:
  receive an input signal,
  produce, using the input signal, an output signal for controlling a switch, and
  receive a signal corresponding to a current through the switch,
wherein the gate driver circuit turns the switch on in response to the input signal being asserted,
wherein the gate driver circuit turns the switch off at a normal turn-off rate in response to the input signal being de-asserted when the current through the switch is determined to be less than a first overcurrent (OC) threshold, and
wherein the gate driver circuit turns the switch off at an OC turn-off rate in response to the input signal being de-asserted when the current through the switch is determined to be greater than the first OC threshold, the OC turn-off rate being slower than the normal turn-off rate.

2. The electronic circuit of claim 1,
wherein the OC threshold is less than a short circuit (SC) threshold;
wherein the gate driver circuit turns the switch off at the OC turn-off rate in response to the input signal being de-asserted when the current through the switch is determined to be greater than the first OC threshold and less than the SC threshold;
wherein the gate driver circuit turns the switch off at an SC turn-off rate in response to the current through the switch being determined to be greater than the SC threshold, the SC turn-off rate being slower than or equal to the OC turn-off rate.

3. The electronic circuit of claim 2, wherein the gate driver circuit produces a signal indicating a fault condition in response to the current through the switch being determined to be greater than the SC threshold.

4. The electronic circuit of claim 1, wherein the OC turn-off rate is selected from among a plurality of OC rates according to a magnitude of the current through the switch.

5. The electronic circuit of claim 4, wherein the OC turn-off rate is selected from among the plurality of OC rates using a plurality of OC thresholds respectively corresponding to the plurality of OC rates,
  wherein the first OC threshold is included in the plurality of OC thresholds, and
  wherein each of the plurality of OC thresholds is different.

6. The electronic circuit of claim 1, wherein determining whether the current through the switch is greater than or less than the OC threshold includes:

performing a comparison of the signal corresponding to the current through the switch to the OC threshold;
filtering a result of the comparison; and
determining whether the current through the switch is greater than or less than the OC threshold according to a result of the filtering.

7. The electronic circuit of claim 1, wherein the gate circuit clamps the sense signal when the switch is turned off.

8. An electronic circuit, comprising:
an output subcircuit coupled to an output signal;
an evaluation subcircuit that receives a sense signal and produces one or more evaluation signals according to respective one or more thresholds; and
a logic control circuit that receives an input signal and the one or more evaluation signals, and that controls the output subcircuit to:
source current to the output signal in response to the input signal be asserted,
sink current from the output signal at a normal turn-off rate in response to the input signal being deasserted when all of the one or more evaluation signals are deasserted, and
sink current from the output signal at a turn-off rate less than the normal turn-off rate in response to the input signal being deasserted when one of the one or more evaluation signals is asserted.

9. The electronic circuit of claim 8, wherein the evaluation subcircuit comprises:
a first overcurrent (OC) evaluation circuit to produce a first OC signal of the one or more evaluation signals by comparing the sense signal to a first OC threshold of the one or more thresholds; and
a short circuit (SC) evaluation circuit to produce an SC signal of the one or more evaluation signals by comparing the sense signal to an SC threshold of the one or more thresholds, the SC threshold circuit being higher than the first OC threshold,
wherein the logic control circuit controls the output subcircuit to:
sink current from the output signal at the normal turn-off rate in response to the input signal being deasserted when the first OC signal is deasserted and the SC signal is deasserted,
sink current from the output signal at a first OC turn-off rate in response to the input signal being deasserted when the first OC signal is asserted and the SC signal is deasserted,
sink current from the output signal at an SC turn-off rate in response to the SC signal being asserted,
wherein the first OC turn-off rate is less than the normal turn-off rate, and
wherein the SC turn-off rate is less than or equal to the OC turn-off rate.

10. The electronic circuit of claim 9,
wherein the first OC evaluation circuit comprises a first comparator to compare the sense signal to the first OC threshold, and a first filter to produce the first OC signal by filtering the output of the first comparator; and
wherein the SC evaluation circuit comprises a second comparator to compare the sense signal to the SC threshold, and a second filter to produce the SC signal by filtering the output of the second comparator.

11. The electronic circuit of claim 9,
wherein the evaluation subcircuit comprises a second OC evaluation circuit to produce a second OC signal of the one or more evaluation signals by comparing the sense signal to a second OC threshold of the one or more thresholds; and
wherein the logic control circuit controls the output subcircuit to:
sink current from the output signal at the first OC turn-off rate in response to the input signal being deasserted when the first OC signal is asserted, the second OC signal is deasserted, and the SC signal is deasserted, and
sink current from the output signal at a second OC turn-off rate in response to the input signal being deasserted when the second OC signal is asserted and the SC signal is deasserted,
wherein the second OC threshold is greater than the first OC threshold and less than the SC threshold, and
wherein the second OC turn-off rate is less than the first OC turn-off rate and greater than or equal to the SC turn-off rate.

12. The electronic circuit of claim 8, further comprising:
a sense signal disable circuit to clamp the sense signal,
wherein the logic control circuit controls the sense signal disable circuit.

13. The electronic circuit of claim 8, wherein the output subcircuit comprises:
a pull-up circuit to source current to the output signal according to a high switch signal produced by the logic control circuit; and
a plurality of pull-down circuits to sink current at a plurality of rates according to one or more low switch signals from the logic control circuit.

14. The electronic circuit of claim 8, further comprising:
a controllable current source to provide current to the sense signal,
wherein the logic control circuit controls the controllable current source.

15. A method of controlling an electronic circuit, the method comprising:
receiving an input signal;
receiving a sense signal having a magnitude corresponding to a current through a switch;
in response to the input signal being asserted, turning on the switch; and
in response to the input signal being deasserted, turning off the switch at a turn-off rate determined according to the magnitude of the sense signal.

16. The method of claim 15, wherein turning off the switch at a turn-off rate determined according to the magnitude of the sense signal includes:
determining whether the magnitude of the sense signal is less than an overcurrent (OC) threshold;
turning off the switch at a normal turn-off rate when the magnitude of the sense signal is determined to be less than the OC threshold; and
turning off the switch at an OC turn-off rate when the magnitude of the sense signal is determined to not be less than the OC threshold,
wherein the OC turn-off rate is slower than the normal turn-off rate.

17. The method of claim 16, wherein turning off the switch at the OC turn-off rate when the magnitude of the sense signal is determined to be greater than the OC threshold includes:
turning off the switch at a first OC turn-off rate when the magnitude of the sense signal is determined to be greater than a first OC threshold and less than a second OC threshold; and turning off the switch at a second OC turn-off rate when the magnitude of the sense signal is determined to be greater than the second OC threshold, wherein the first OC threshold is less than the second OC threshold, and wherein the first OC turn-off rate is faster than the second OC turn-off rate.

18. The method of claim 16, wherein determining whether the magnitude of the sense signal is less than the OC threshold includes:

performing a comparison of the magnitude of the sense signal to the OC threshold; and filtering the result of the comparison.

19. The method of claim 15, further comprising:

determining whether the magnitude of the sense signal is less than a short circuit (SC) threshold; and in response to determining that the magnitude of the sense signal is not less than the SC threshold, turning off the switch at an SC turn-off rate.

20. The method of claim 15, wherein turning off the switch at the turn-off rate determined according to the magnitude of the sense signal is performed by controlling a magnitude of a current of a control terminal of the switch according to the magnitude of the sense signal.

* * * * *